United States Patent [19]
Read

[11] Patent Number: 4,722,135
[45] Date of Patent: Feb. 2, 1988

[54] APPARATUS FOR PLACING SURFACE MOUNTING DEVICES ON A PRINTER CIRCUIT BOARD

[75] Inventor: John M. Read, Charlottesville, Va.

[73] Assignee: General Electric Co., Charlottesville, Va.

[21] Appl. No.: 826,956

[22] Filed: Feb. 7, 1986

[51] Int. Cl.$^4$ ............................................. H05K 13/04
[52] U.S. Cl. ........................................ 29/740; 29/743; 29/834
[58] Field of Search .......... 29/740, 743, 759, 834–838, 29/840

[56] References Cited

U.S. PATENT DOCUMENTS

| | | | |
|---|---|---|---|
| 3,174,673 | 3/1965 | Horbach | 29/834 X |
| 3,881,605 | 5/1975 | Grossman | 198/394 X |
| 3,909,933 | 10/1975 | Doubek, Jr. et al. | 29/836 |
| 4,476,626 | 10/1984 | Gumbert et al. | 29/834 X |
| 4,528,746 | 7/1985 | Yoshimura | 29/743 |

FOREIGN PATENT DOCUMENTS 2063227 6/1981 United Kingdom ................. 29/834

Primary Examiner—Howard N. Goldberg
Assistant Examiner—Taylor J. Ross
Attorney, Agent, or Firm—Irving M. Freedman; Ormand R. Austin

[57] ABSTRACT

The disclosed invention provides manually operated apparatus for precise placement of surface mounting integrated circuit devices on a printed circuit board. A dispensing unit operates to position a device into an oriented, predetermined position with respect to a first reference member, and a hand-held pickup unit is manipulated to pick up the positioned device from the dispensing unit while fixing its position with respect to a second reference on the pickup unit. The device in the pickup unit is transferred to and placed upon a prepared printed circuit board. The device is maintained in the same position relative to the two references and the desired placement points on the printed circuit board.

6 Claims, 8 Drawing Figures

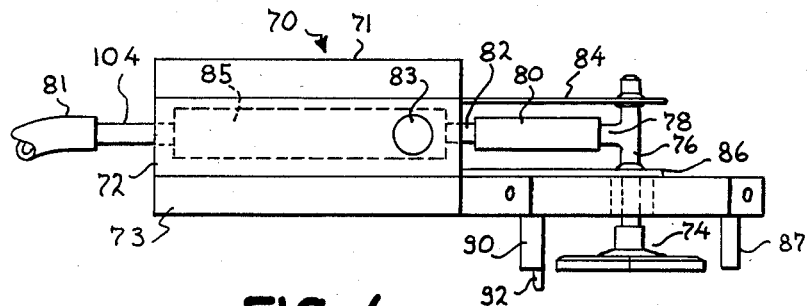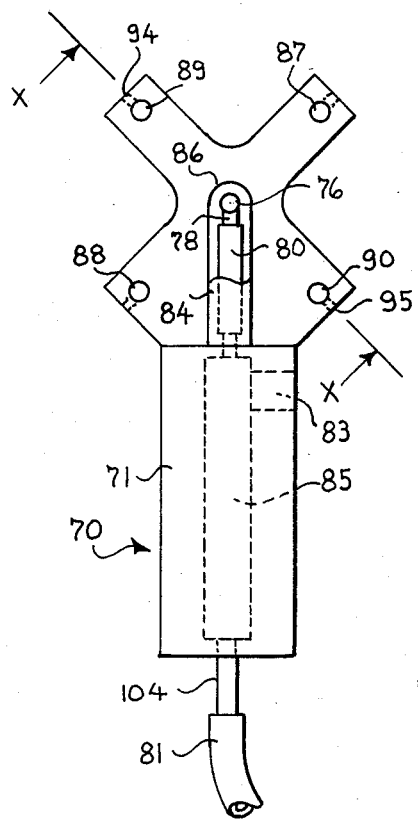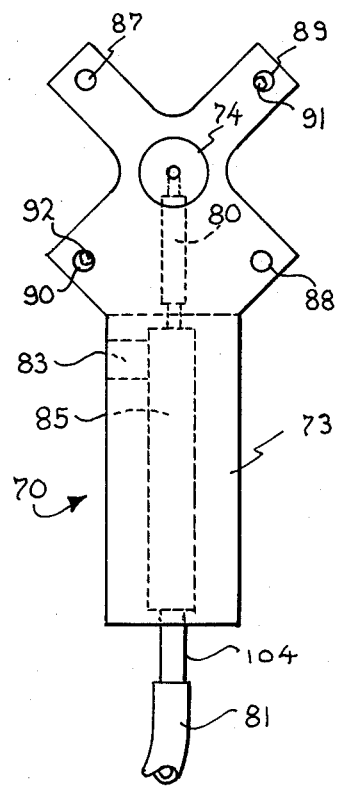

APPARATUS FOR PLACING SURFACE MOUNTING DEVICES ON A PRINTER CIRCUIT BOARD

BACKGROUND OF THE INVENTION

A current trend in mounting integrated circuits on printed circuit boards is to make use of surface mounting integrated circuit devices. These devices differ from their predecessor integrated circuit packages in that the leads do not fit into plated holes in the circuit board, but rather just rest on and are soldered directly to the top surface of the circuit board. Equipment designed to insert the more conventional integrated circuit devices on a printed circuit board does not lend itself to mounting these newer type devices and considerable effort has been expended to provide equipment which will automate their placement and mounting. Although some success has been achieved in providing equipment which is satisfactory for relatively high volume placement, there is no known method or apparatus for economically, precisely, and easily placing individual surface mounting devices at low volume. For example, other than by an inefficient use of the high volume equipment or by visual alignment using tweezers, etc. there is no known means to place just one (or a few) surface mounting integrated circuit components per board.

Accordingly, it is an object of the present invention to provide apparatus by which these shortcomings are overcome.

SUMMARY OF THE INVENTION

In brief summary, a preferred form of the invention comprises two major components: (1) a dispensing unit which is operative to position a device to be mounted into an oriented, predetermined position with respect to a first reference member; and (2) a moveable (by hand) pickup unit which is used to engage the dispensing unit, pick up the device while fixing its position with respect to a second reference member on the pickup unit, and transfer the device to a printed circuit board upon disengagement from the dispensing unit. The device is always maintained in the same position relative to the two references and to the desired placement points upon the printed circuit board.

The dispensing unit holds a cartridge containing a number of devices to be placed and includes an electromechanical mechanism for releasing one device at a time from the cartridge. The released device is directed into a predetermined orientation in a formed receptacle which can be positioned relative to the first reference member. Preferably the first reference member forms a portion of the means whereby the dispensing unit and the pickup unit are engaged.

The pickup unit is hand held and includes a handle for such purpose. Means for latching onto, and temporarily holding, the device to be placed is included in the pickup unit. The latching means preferably comprises a selectively activated vacuum suction cup which forms an attachment to the flat, upper surface of the device to be mounted. The second reference member, as part of the pickup unit, also forms a portion of the means for engaging the dispensing unit and the pickup unit.

In operation, a device is released into the receptacle in an oriented, preselected position with respect to the first reference member. The pickup unit is then engaged with the dispensing unit and the device is latched into the pickup unit by activation of the vacuum suction cup which attaches to the device. The first and second references provide engagement between the pickup unit and the dispensing unit. These references are located so that the position of the device in the pickup unit with respect to the second reference is the same as in the dispensing unit with respect to the first reference. Each reference is located so that placement of the pickup unit on the prepared printed circuit board sets the device down in the precise position desired.

BRIEF DESCRIPTION OF THE DRAWINGS

While the specification concludes with claims particularly pointing out and distinctly claiming the subject matter regarded as the invention, the invention will be better understood from the following description taken in connection with the accompanying drawings, in which:

FIG. 3 illustrates a typical cartridge loaded with surface mounting devices in a preoriented position;

FIG. 4 is a sideview of a hand-held pickup unit;

FIG. 5 is a top view, showing fluid passageways through the handle, of the hand-held pickup unit of FIG. 4;

FIG. 6 is a bottom view, also showing fluid passageways, of the hand-held pickup unit of FIG. 4;

DETAILED DESCRIPTION OF THE INVENTION

Figure 1:
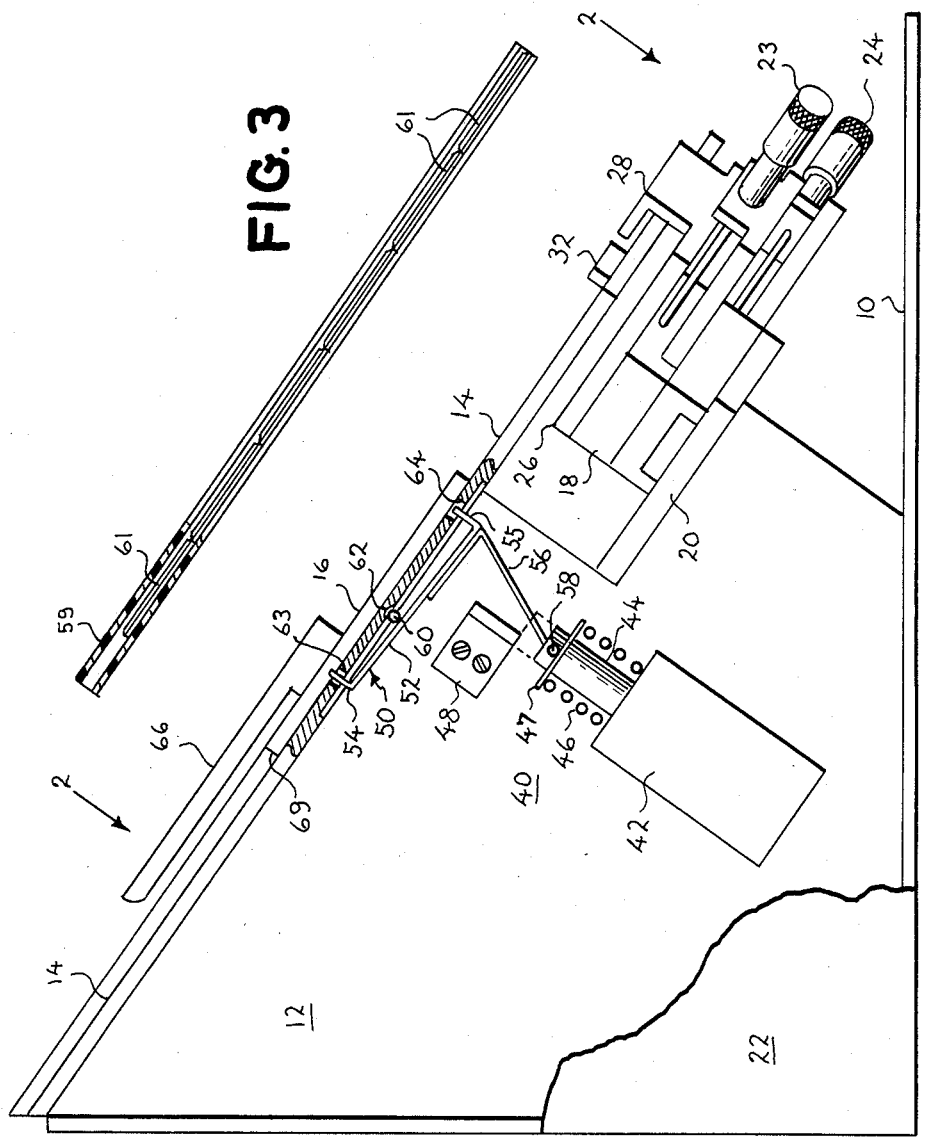
FIG. 1 is an elevational view, from one side, and with certain portions cut away, of a device dispensing unit.
Figure 2:
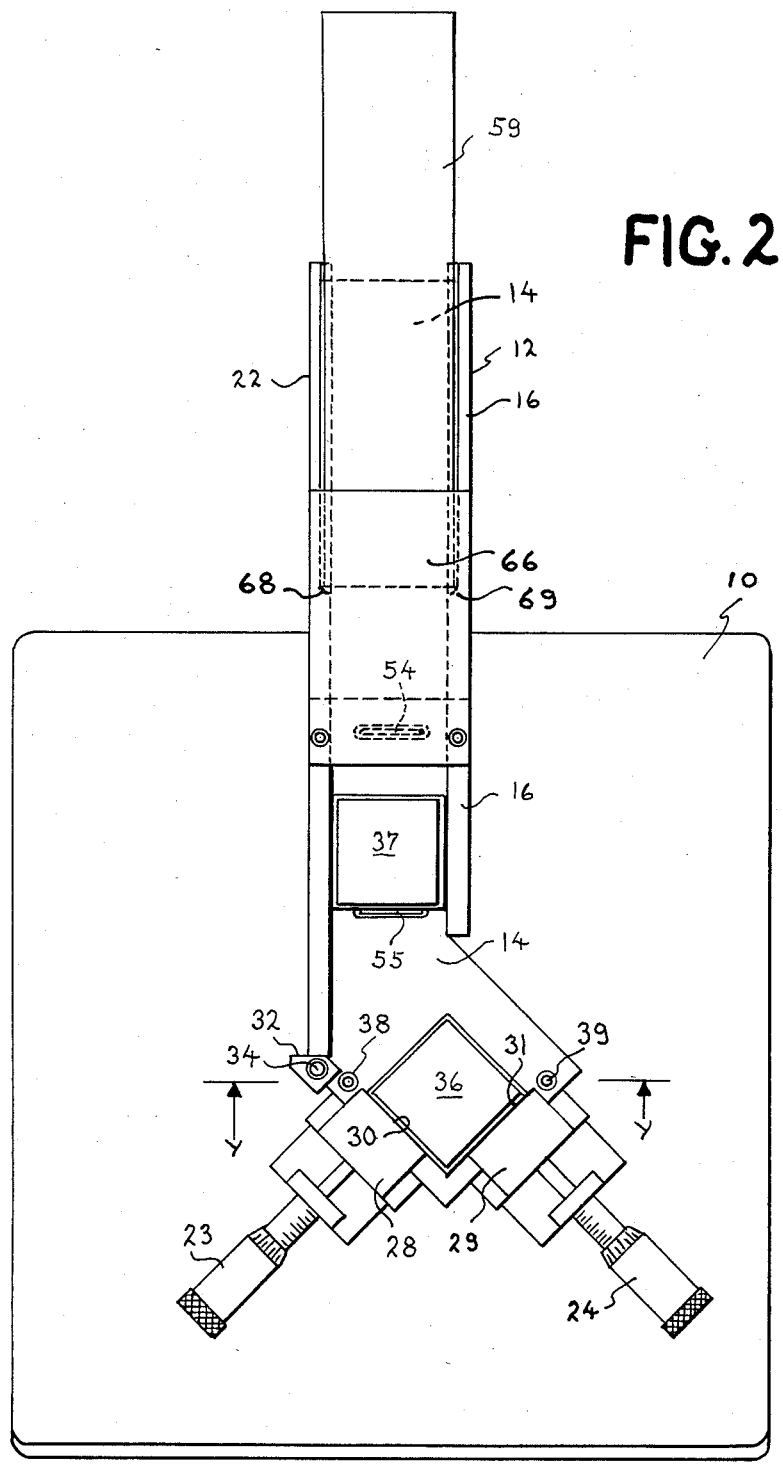
FIG. 2 is a plan view of the device dispensing unit taken along lines 2—2 of FIG. 1.

With reference to FIGS. 1 and 2, the device dispensing unit includes a base plate 10 which is typically in a horizontal plane for resting the unit upon a table or workbench. An upright section 12 is attached to the base plate 10 by screws or similar means (not specifically shown) so that the upright section 12 is at a right angle to the base plate 10 and generally in a vertical plane.

Near the top of the upright section 12 and substantially at a right angle thereto is a device slide plate 14. The top edge of the upright section slants at about a forty-five degree angle so that the device slide plate 14 also slants at the same angle. The top surface of the slide plate 14 is attached to the upright section 12 just below its upper edge 16 so that the upper edge 16 forms a right-hand guide surface for a dispensed device.

The lower end of the slide plate 14 is enlarged somewhat and is angled to one side as shown in FIG. 2. The lower end of the slide plate is fitted with an X-Y table 18 attached to a mounting plate 20 which, in turn, is attached to the upright section 12. A cover plate 22 attaches to the slide plate 14 on the side opposite the upright section 12 and forms a left-hand guide surface for a dispensed device. The cover plate 22 is removed in FIG. 1 for better illustration of all component parts. Screws may be used for attaching these components, although for purposes of simplification they are not illustrated.

Generally, the X-Y table 18 comprises a mechanism, such as a screw and nut arrangement, for effecting motion of the table along two mutually perpendicular axes. The X-Y table 18 thus includes individual micrometer adjustment means, 23 and 24, for adjusting the positioning of the table 18 along each of the perpendicular axis. The X-Y table 18 may be one of a number of commercially available items of such hardware, including for example, a Model 101-XY, available from Del-Tron Precision, Inc., Brookfield, CT.

Attached to the top of the X-Y table 18 is a positioning frame 26 which is planar at the surface which mates with the X-Y table 18 but which includes two extending arms 28 and 29 which bend back over the top, lower end of the slide plate 14. The arms 28 and 29 provide positioning edges 30 and 31, respectively, which are at right angles to each other. The positioning edges 30 and 31 together form a V-shaped notch but without the point of the V. The arms 28 and 29 are spaced apart from the slide plate and are therefore free to move with movement of the X-Y table 18. The positioning frame 26 is attached to the X-Y table 18 by screws, not illustrated. The lower end of the slide plate 14 also has attached to it adjacent the left hand positioning arm 28, and abutting the end of the cover plate 22, a deflector member 32 which is held in place by hex-head screw 34. The function of the deflector member 32 will become clear as operation of the apparatus is explained. For now, it is enough to note that the defector simply deflects an integrated circuit device into a predetermined orientation.

The lower end of slide plate 14 along with the arms 28 and 29 of the positioning frame 26 thus forms a receptacle for a surface mounting device to be positioned for pickup. A device 36, for example, is shown in place in this formed receptacle in FIG. 2 (omitted from FIG. 1 for simplicity).

Also at the lower end of the slide plate 14 are a pair of hardened bushings 38 and 39 set into the slide plate. These bushings 38 and 39 provide means for engagement of the hand-held pickup unit (to be more fully described) and serve also as reference members or reference points for the position of the device retained in the receptacle as described above.

With particular reference to FIG. 1, the dispensing unit also includes a device release mechanism 40 comprising a solenoid 42 having an armature 44 which is moveable between first and second positions corresponding to electrical deenergization and energization of the solenoid 42, respectively; a spring 46 and washer 47 arrangement for biasing the armature 44 toward its first (deenergized) position; a mechanical stop 48 attached to the upright section 12 and operative to mechanically stop the armature 44 in its first position; and a sheet metal gating member 50.

The gating member 50 is formed of a flat strip of sheet metal (e.g., brass) about one half the width of a surface mounting device. The gating member 50 is essentially in two sections; the main section 52 is a flat ribbon of sheet metal having an upward turned, right-angled upper tab 54 at one end and an upward turned right-angled lower tab 55 at the other end; the connecting section 56 of the gating member 50 is bent at an acute angle and is attached (as by soldering or welding) along one surface to the main section 52 and is attached to the armature 44 at the opposite end. The attachment to the armature 44 is preferably around the pin 58 passing through the end of the armature 44 to retain spring 46 and washer 47.

A pivot pin 60 is transversely attached to the top side of the main section 52 of the gating member 50 (e.g., by solder) and the ends of the pivot pin are retained in small grooves 62 (only one of which appears in FIG. 1) formed in the underside of the slide plate 14. The underside of the slide plate adjacent the main section 52 of the gating member 50 is slightly undercut to accommodate this section. The pivot pin is slightly off center of the main section 52, positioned slightly nearer the upper tab 54 then the lower tab 55. The pivot pin may be retained in the groove 62 by washers held in place by screws adjacent the pivot pin 60. For simplification, however, such retaining screws are not illustrated in FIG. 1.

The tab ends 54 and 55 of the gating member project into slots 63 and 64, respectively, which are cut through the slide plate 14. Depending on the position of the armature 44, either the lower tab 55 (solenoid deenergized) or the upper tab 54 (solenoid energized) projects through the slide plate 14 for some slight distance above the upper surface thereof. When the position of the armature 44 is changed, therefore, one of the tabs is withdrawn below the slide plate surface and the other projects above the slide plate surface. The lower tab 55 is dimensioned to project higher above the slide plate surface than the upper tab 54. The gating member 50 is simply caused to pivot on the pivot pin 60 by energizing and deenergizing the solenoid 42.

The upper end of the slide plate 14 is adapted to receive and retain a cartridge containing a plurality of the surface mounting circuit devices to be replaced. An example of a cartridge 59 containing devices 61 in a preoriented position is shown in FIG. 3. For retaining the cartridge, a cartridge retainer cover 66 is secured to the slide cover plate 22 and the upright member 12 by hex-head screws. The cartridge is inserted into the retainer cover 66, guided by the cover plate 22 and the upright member 12, and is bottomed out on a shoulder 68 on the inner surface of slide cover 22 and a shoulder 69 on the inner surface of upright member 12. These shoulders are formed by removing portions of the left and right hand guide surface from the upper ends of the cover plate 22 and the upright member 12. The devices in the cartridge are free to pass out of the end of the cartridge under the force of gravity.

FIGS. 4, 5, and 6 illustrate the pickup unit which engages the dispensing unit to pick up a device and retain it in a fixed, reference position until it is securely located on a printed circuit board.

The pickup unit includes a handle, generally 70, adapted to make the pickup unit hand-held and easy to manipulate.

The handle 70 is of three bolted together pieces 71, 72, and 73, the lower one of which (73) projects at the end opposite the handle to form the device pickup end of the pickup unit. The projecting end of piece 73 is somewhat in the form of an X to eliminate unnecessary material and aid visibility. The pickup end includes a latching means comprising a rubber suction cup 74 fitted to the end of a hollow tube 76 which extends generally upward (with the unit in a normal position) at a right angle to the broad, somewhat flattened end of the suction cup 74. The upward extending hollow tube 76 is capped closed at the top and has a side arm 78 forming a T-shaped fitting. To the side arm 78, a flexible piece of tubing 80 is fitted which couples the hollow tube 76 to a second tube 82 which interconnects to cylindrical cavity 85 in the center piece 72 of the handle.

The hollow tube and suction cup combination is spring loaded by a pair of leaf springs comprising an upper spring 84 (attached to tube 76 above the side arm 78) and a lower spring 86 (attached below the side arm 78). These springs, 84 and 86, are of shim-like sheet metal material secured to the tube 76 by soldering or similar bonding. The other end of the leaf springs 84 and 86 are clamped between sections of the handle 70 by the screws which hold the three sections 71, 72, and 73 together. The springs 84 and 86 allow the suction cup 74 to conform to devices of different thicknesses while maintaining the positional relationship of a device to the references. The arrangement of springs 84 and 86 produces essentially linear motion of the tube 76 and the suction cup 74.

At a right angle to the cylindrical cavity 85 which passes through the handle 70, a vacuum control hole 83 is provided in the handle center piece 72 near the pickup end. The vacuum control hole 83 is sized at its open end so as to be easily capped closed by an operator's finger when the pickup unit is hand-held. The other end of the vacuum control hole 83 opens into the cylindrical cavity 85 inside the handle so that, uncapped, there is fluid communication between the cylindrical cavity 85 and the atmosphere. In operation, the terminal end of the cylindrical cavity 85 is connected to a vacuum source (not shown) by a tube 104 and flexible tubing 81.

Figure 7:
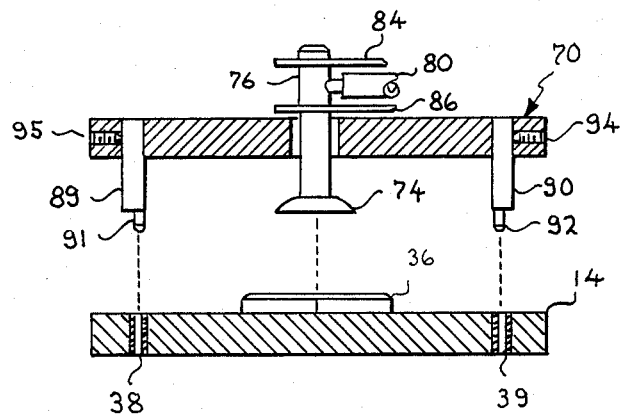
FIG. 7 is a cross-sectional view of the pickup unit (along x—x of FIG. 5) and of the receptacle end of the dispensing unit (along y—y of FIG. 2) showing the method of engagement of the two units.

Projecting from the underside of the X-shaped end of piece 73, generally parallel with and somewhat surrounding the tube 76 and suction cup 74, are four pins 87, 88, 89, and 90. These pins are paired for operative purposes on diagonals across the pickup end. Pins 87 and 88 are simply kick stand pins serving to bottom out on a printed circuit board, for example, when in use. Pins 89 and 90, however, are reference pins and provide for engagement of the pickup unit with the dispensing unit. Extending longitudinally from the ends of each reference pin 89 and 90 is a smaller pin, 91 and 92, respectively, each of which is eccentrically located with respect to the longitudinal axis of the overall reference pin. To effect engagement of the pickup unit with the dispensing unit, these smaller pins insert into mating bushings 38 and 39 (FIG. 2) of the dispensing unit. The method of engagement as illustrated in FIG. 7.

As will become clear, reference pins 89 and 90 serve also as reference members for the position of a device held in the pickup unit. The position of the device with respect to the pickup unit reference is the same as with respect to the reference members of the dispensing unit. The eccentric location of the smaller, engaging pins 91 and 92 allows slight adjustments of the relative fit between the pins 91, 92 and the mating bushings 38 and 39 since reference pins 89 and 90 can be rotated. Rotation is achieved by loosening the set screws 94 and 95 which hold the pins in sockets in piece 73.

Operation of the invention can be understood by reference to FIGS. 1-8. In operation, the dispensing unit is loaded with a cartridge containing a plurality of devices to be placed on a printed circuit board. Such cartridges are supplied by the device manufacturer with devices in a pre-oriented position within the cartridge. FIG. 3 shows a typical cartridge. The devices are free to slide out of the cartridge but are retained by the lower tab 55 of the gating number 50 projecting up through slot 64. That is, the solenoid 42 is normally deenergized. The spacing between the upper and lower tabs 54 and 55, respectively, is less than the width of two devices but greater than the width of one device. Therefore, one device is always positioned directly over the upper tab 54 and one device is retained at lower tab 55. In FIG. 2, for example, a surface mounting device 37 is shown in place against the lower tab 55 while another such device 36 is shown in the receptacle formed at the bottom of the slide plate 14.

Solenoid 42 is energized momentarily to release a device past the lower tab 55. Simultaneously, the upper tab 54 pinches the next in line device to prevent its movement. Once the solenoid 42 is deenergized the pinch on the next in line device is released and that device moves into position against the lower tab 55. Simultaneously another device moves into position directly over the upper tab 54.

As the released device slides down the slide plate 14, one corner strikes the deflector member 32 which deflects the device in predetermined orientation into the receptacle at the lower end of the slide plate 14. The device is then in a fixed position relative to the reference bushings 38 and 39. If desired, however, the device can be positioned relative to these references by manipulating the x-y table 18 through either or both of the micrometer adjustment means 23 and 24.

With a device in the receptacle on the dispensing unit, the pickup unit is engaged with the dispensing unit as shown in FIG. 7. The small pins 91 and 92 extending from the ends of the reference pins 89 and 90 mate with reference bushings 38 and 39, bringing the suction cup 74 into contact with the flat upper surface of the device. The operator then caps the vacuum control hole 83 with his finger, latching the device into the pick up unit. With the device latched in, the pickup unit is disengaged from the dispensing unit. Importantly, the position of the device with respect to the reference pins 89 and 90 is the same as it was with respect to the reference bushings 38 and 39.

Figure 8:
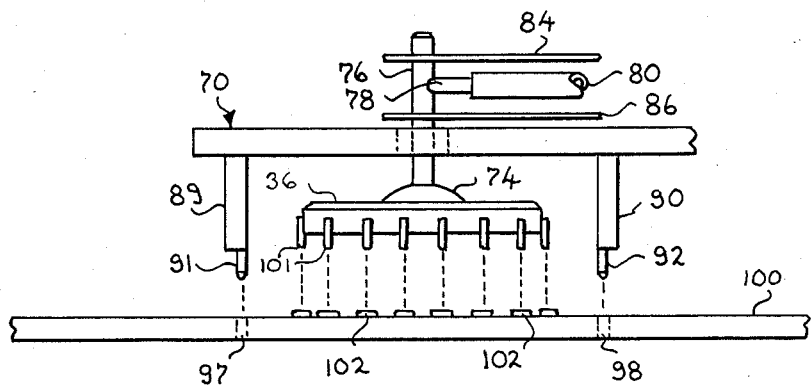
FIG. 8 shows the pickup end of the pickup unit with a latched-in device and illustrates the placement of the device on the printed circuit board.

The pickup unit, with the latched-in device 36, is then placed on the prepared printed circuit board as shown in FIG. 8. That is, pins 91 and 92 are mated with placement holes 97 and 98 on the printed circuit board 100. The lead pins 101 of the device are in proper position relative to the solder pads 102 on printed circuit board 100. If the relative position is not correct, the device can be re-placed on the dispensing unit, positioned by means of the X-Y table 18 with respect to the references and then re-placed on the printed circuit board. The device is released into place on the circuit board 100 when the operator uncaps the vacuum control hole 83. As the pick up unit is moved away, the device is held for flow soldering, by the paste which has been previously placed on the solder pads 102 as part of the surface mounting process.

Thus, while there has been shown and described what is considered a preferred embodiment of the invention, it is understood that various other modifications may be made therein. It is intended to claim all such modifications which fall within the true spirit and scope of the present invention.

What is claimed is:

1. Apparatus for placing a surface mounting device in precise location upon a printed circuit board adapted to receive the device, such apparatus comprising a dispensing unit and a pickup unit freely engageable with each other and wherein:

A. said dispensing unit includes (a) means for holding a plurality of devices of the type to be placed;

(b) a release mechanism for releasing from said holding means one device at a time;

(c) means for directing the released device into a predetermined orientation;

(d) a receptacle for receiving the released device and retaining it in said predetermined orientation;

(e) a first reference means operative in engagement of the dispensing unit and the pickup unit; and (f) means for positioning the receptacle for positioning the device in two dimensions with respect to the first reference means; and B. said pickup unit includes (a) a handle for manual manipulation of the pickup unit into engagement with the dispensing unit and into position on the printed circuit board;

(b) second reference means operative in combination with said first reference means to effect engagement of the pickup and dispensing units; and (c) latching means attached to the handle, for latching onto the released device as it is retained in the receptacle and for holding said device for removal from the receptacle and placement upon the printed circuit board; and whereby the device to be placed is positionable within the receptacle with precise reference to the first reference means and upon engagement of the pickup unit and the dispensing unit substantially indentical position is established between the device and the second reference for placement of the device upon the printed circuit board.

2. The apparatus of claim 1 wherein the first reference means comprises a pair of bushings and the second reference means comprises a pair of plugs for mating engagement with the pair of bushings.

3. The apparatus of claim 2 wherein the release mechanism comprises a solenoid activated gating means.

4. The apparatus of claim 3 wherein the positioning means comprises an x-y table for positioning the receptacle along two mutually perpendicular axes.

5. The apparatus of claim 4 wherein said latching means comprises a vacuum activated suction cup.

6. The apparatus of claim 5 wherein each plug of the pair of plugs includes an engaging pin eccentrically located with respect to the longitudinal axis of the plug, for fine adjustment of the engaged position of the pickup unit.

* * * * *